United States Patent
Zhang et al.

(10) Patent No.: US 8,795,489 B2
(45) Date of Patent: Aug. 5, 2014

(54) SPUTTERING TARGET AND METHOD FOR PRODUCING THE SAME

(75) Inventors: Shoubin Zhang, Sanda (JP); Yoshinori Shirai, Sanda (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 13/262,540

(22) PCT Filed: Nov. 4, 2010

(86) PCT No.: PCT/JP2010/006481
§ 371 (c)(1),
(2), (4) Date: Sep. 30, 2011

(87) PCT Pub. No.: WO2011/055537
PCT Pub. Date: May 12, 2011

(65) Prior Publication Data
US 2012/0217157 A1    Aug. 30, 2012

(30) Foreign Application Priority Data

Nov. 6, 2009  (JP) ................................. 2009-255540
Oct. 28, 2010  (JP) ................................. 2010-241749

(51) Int. Cl.
*C23C 14/34*    (2006.01)
(52) U.S. Cl.
CPC ................................. *C23C 14/3414* (2013.01)
USPC ............ 204/298.13; 419/10; 419/48; 419/49; 419/57; 419/60; 75/247
(58) Field of Classification Search
CPC .................................................. C23C 14/3414
USPC ............... 204/298.13; 419/10, 48, 49, 57, 60; 75/245, 246, 247
See application file for complete search history.

(56) References Cited

U.S. PATENT DOCUMENTS

| | | | | |
|---|---|---|---|---|
| 4,960,581 | A | * | 10/1990 | Harada et al. .................. 423/489 |
| 5,824,923 | A | * | 10/1998 | Kondoh et al. .................. 75/247 |
| 7,780,826 | B2 | * | 8/2010 | Sawada et al. ............ 204/298.13 |
| 2007/0053786 | A1 | * | 3/2007 | Nonaka et al. ................. 420/579 |
| 2010/0116341 | A1 | * | 5/2010 | Huang et al. .................. 136/262 |
| 2011/0024285 | A1 | * | 2/2011 | Juliano ..................... 204/192.17 |

FOREIGN PATENT DOCUMENTS

| | | |
|---|---|---|
| CN | 101260513 B | 4/2011 |
| CN | 101397647 B | 8/2011 |
| JP | 08-195501 | 7/1996 |
| JP | 2008138232 A * | 6/2008 |
| JP | 2010-225883 | 10/2010 |
| JP | 2010225883 A | 10/2010 |
| TW | 200927967 A | 7/2009 |
| WO | 2008134516 A2 | 11/2008 |
| WO | 2009041660 A1 | 4/2009 |

OTHER PUBLICATIONS

Machine Translation to Otomo (JP 2008-138232) published Jun. 2008.*
Tanaka, Tooru et al, Preparation of Cu(IN,Ga)2Se3.5 thin films by radio frequency sputtering from stoichiometric Cu(In,Ga)Se2 and Na2Se mixture target, J. Appl. Phys. 81, 7619 (1997).*
Search Report for Chinese Patent Application No. 201080017285.X (Jun. 19, 2012).
Supplementary European Search Report for EP 10828098.3 dated Feb. 14, 2012.
H.G. Severin: "Materialien fur die Kathoden-Zerstaubung", Vakuum Technik, vol. 33, No. 1, Dec. 31, 1983, pp. 3-9, XP002669518.
International Search Report of PCT/JP2010/006481, May 2011.
D. Rudmann e al; Effects of NaF Coevaporation on Structural Properties of Cu(In,Ga) Se2 Thin Films; Thin Solid Films; vol. 431-432, 2003, p. 37-40.
R. Caballero et al. The Influence of Na on Low Temperature Growth of CIGS Thin Film Solar Cells on Polyimide Substrates; Thin Solid Films; vol. 517, Nov. 6, 2008, p. 2187-2190.

* cited by examiner

*Primary Examiner* — John Brayton
(74) *Attorney, Agent, or Firm* — Edwards Wildman Palmer LLP; Jeffrey D. Hsi

(57) ABSTRACT

[Problems]
To provide a sputtering target that is capable of forming a Cu—Ga film to which Na is favorably added by a sputtering method, and a method for producing the same.
[Means for Solving the Problems]
The sputtering target is provided wherein 20 to 40 at % of Ga and 0.05 to 1 at % of Na are contained as metal components except fluorine (F) of the sputtering target, a remaining portion has a component composition consisting of Cu and unavoidable impurities, and Na is contained in the state of a NaF compound. Also, a method for producing the sputtering target includes the steps of forming a molded article consisting of a mixed powder of NaF powder and Cu—Ga powder or a mixed powder of NaF powder, Cu—Ga powder, and Cu powder; and sintering the molded article in a vacuum atmosphere, an inert gas atmosphere, or a reducing atmosphere.

8 Claims, No Drawings

US 8,795,489 B2

SPUTTERING TARGET AND METHOD FOR PRODUCING THE SAME

CROSS-REFERENCE TO RELATED APPLICATIONS

This application is the national phase under 35 U.S.C. §371 of PCT International Application No.: PCT/JP2010/006481, filed Nov. 4, 2010, which claims priority of Japanese Application No.: 2009-255540, filed on Nov. 6, 2009, and Japanese Application No. 2010-241749, filed on Oct. 28, 2010. The contents of each of these applications are incorporated herein by reference in their entirety.

BACKGROUND OF THE INVENTION

1. Field of the Invention

The present invention relates to a sputtering target for use in forming a Cu—In—Ga—Se ternary alloy film for forming a light absorbing layer of a solar cell, and a method for producing the same.

2. Description of the Related Art

In recent years, thin film solar cells made by using a compound semiconductor have been practically employed. The thin film solar cell made by using the compound semiconductor has a basic structure in which an Mo electrode layer serving as a positive electrode is formed on a sodalime glass substrate, a light absorbing layer consisting of a Cu—In—Ga—Se ternary alloy film is formed on the Mo electrode layer, a buffer layer consisting of ZnS, CdS, and the like is formed on the light absorbing layer consisting of the Cu—In—Ga—Se ternary alloy film, and a transparent electrode layer serving as a minus electrode is formed on the buffer layer.

As a method for forming a light absorbing layer consisting of the Cu—In—Ga—Se ternary alloy film described above, a vapor deposition film-forming method is known. Although a light absorbing layer consisting of a Cu—In—Ga—Se ternary alloy film, which has been obtained by the method, may exhibit high energy conversion efficiency, the vapor deposition film-forming method attains slow speed for forming a film. Hence, when a large area film is formed, the uniformity of the in-plane distribution of the film thickness may not be ensured. Therefore, a sputtering method for forming a light absorbing layer consisting of a Cu—In—Ga—Se ternary alloy film has been proposed.

As a sputtering method for forming a Cu—In—Ga—Se ternary alloy film, a method (so called "selenization method") has been proposed in which an In film is firstly formed by sputtering using an In target, a Cu—Ga binary alloy target is employed and sputtered on the In film to thereby form a Cu—Ga binary alloy film, and a film stack consisting of the obtained In film and Cu—Ga binary alloy film is subject to heat treatment in a Se atmosphere to thereby form a Cu—In—Ga—Se ternary alloy film (see Patent Document 1).

On the other hand, in order to improve the power generation efficiency of a light absorbing layer consisting of a Cu—In—Ga—Se ternary alloy film, the addition of Na to the light absorbing layer is required. For example, Non-Patent Document 1 proposes the fact that Na content in a precursor film (Cu—In—Ga—Se ternary alloy film) is typically about 0.1%.

PRIOR ART DOCUMENTS

Patent Document

[Patent Document 1] Japanese Patent No. 3249408

Non-Patent Document

[Non-Patent Document 1] A. Romeo, "Development of Thin-film Cu(In, Ga)Se2 and CdTe Solar Cells", Prog. Photovolt: Res. Appl. 2004; 12:93-111 (DOI: 10.1002/pip. 527

SUMMARY OF THE INVENTION

Problems to be Solved by the Invention

The following problems still remain in the conventional techniques described above.

Specifically, the sputtering method is disadvantageous in that the addition of Na to the sputtering target is very difficult. In particular, in the production of solar cells using the selenization method as disclosed in Patent Document 1, a Cu—Ga target is employed for forming a Cu—Ga film, but Na is not in solid solution with Cu, both the melting point (98° C.) and the boiling point (883° C.) of metal Na are very low, and metal Na is extremely readily oxidized. Therefore, the selenization method is disadvantageous in that the addition of metal Na to the Cu—Ga target is very difficult.

The present invention has been made in view of the aforementioned circumstances, and an object of the present invention is to provide a sputtering target that is capable of forming a Cu—Ga film to which Na is favorably added by a sputtering method, and a method for producing the same.

Means for Solving the Problems

The present inventors have studied the method for producing a Cu—Ga target to which Na is favorably added. Consequently, the present inventors have found that Na may be favorably added to a Cu—Ga target if the compound state of NaF instead of the metal state of Na is added thereto.

Therefore, the present invention has been made on the basis of the finding, and adopts the following configuration in order to overcome the aforementioned problems. Specifically, the sputtering target of the present invention is characterized in that 20 to 40 at % of Ga and 0.05 to 1 at % of Na are contained as metal components except fluorine (F) of the sputtering target, a remaining portion has a component composition consisting of Cu and unavoidable impurities, and Na is contained in the state of a NaF compound.

In the sputtering target, 20 to 40 at % of Ga and 0.05 to 1 at % of Na are contained as metal components except fluorine (F) of the sputtering target, a remaining portion has a component composition consisting of Cu and unavoidable impurities, and Na is contained in the state of a NaF compound. Thus, a Cu—Ga film favorably containing Na which has a high melting point (993° C.) and a boiling point (1700° C.) and is effective for the improvement in power generation efficiency may be formed using the sputtering method. It should be noted that fluorine (F) entrapped in a Cu—Ga film containing Na can be completely removed from the Cu—Ga film by a high temperature heat treatment (equal to or lower than the temperature at which a sodalime glass is softened, i.e., about 550° C. or lower) by means of the selenization method.

The reason why the amount of Na added is set within the range is as follows. If the Na content in the Cu—Ga target exceeds 1 at %, a large amount of fluorine (F) is entrapped in a film and is difficult to be removed by a post solar cell manufacturing step. At the same time, an excessively large amount of Na may be contained in the film, resulting in a reduction in compactness of a Cu—In—Ga—Se film and deterioration in power generation properties. On the other hand, if the Na content in the Cu—Ga target is less than 0.05 at %, the amount of Na in a film is in short, and thus, the effect of improving power generation efficiency may not be obtained. Note that the Na content in the Cu—Ga target is preferably in the range of 0.1 to 0.5 at %.

Also, the sputtering target of the present invention is characterized in that the sputtering target has a structure in which NaF is dispersed in the target green body and the average particle size of the NaF is 5 μm or lower.

The nonconductive compound state of NaF is added to a conductive Cu—Ga target. Thus, if direct-current sputtering is subject to the Cu—Ga target as in the conventional Cu—Ga target, abnormal discharge due to NaF often occurs. The light absorbing layer of a solar cell is very thick (e.g., 1000 to 2000 nm), and thus, the Cu—Ga film is very thick, resulting in a necessity of sputtering for a long period of time. If sputtering is interrupted due to abnormal discharge, a considerable deposition time is required. Consequently, direct-current sputtering may not be performed at high speed, resulting in a difficulty in the mass production of solar cells. In order to suppress such abnormal discharge, the sputtering target of the present invention enables direct-current sputtering to be performed as in the conventional Cu—Ga target by optimizing the particle size of NaF in the target green body.

Specifically, in the sputtering target of the present invention, the sputtering target has a structure in which NaF is dispersed in the target green body and the average particle size of the NaF is 5 μm or lower, whereby abnormal discharge due to NaF may be suppressed, and thus, stable direct-current sputtering may become possible. Since the contained NaF is an insulator material, abnormal discharge often occurs if the average particle size of NaF exceeds 5 μm, whereby direct-current sputtering becomes unstable. Therefore, in the present invention, abnormal discharge may be suppressed, and thus, stable direct-current sputtering may become possible by setting the average particle size of NaF to be 5 μm or lower.

In order to suppress abnormal discharge, the number of NaF particles in the field of view of 0.1 mm$^2$, when the cross-section of the target is observed using a SEM, is preferably three or less if there are NaF particles having a large particle diameter of 10 μm to 40 μm.

Also, the sputtering target of the present invention is characterized in that Ga in the target green body is contained in a form of a Cu—Ga binary alloy.

The present inventors have found out that, when NaF is added to a sputtering target, the presence of Ga simple substance in the target green body may affect on resistance to cracking during sputtering of the target. Specifically, the present inventors have found out that, if Ga simple substance is contained in the target, the Cu—Ga target containing NaF may be very fragile, and thus, a processing defect such as chipping may easily occur upon machine processing after sintering.

In order to solve the problems, the sputtering target of the present invention is characterized in that Ga in the target green body is contained in a form of a Cu—Ga binary alloy. Specifically, by setting Ga to a Cu—Ga solid solution or a Cu—Ga intermetallic compound, stable sputtering may be realized without the occurrence of cracking after sintering, after machine processing, and during sputtering.

The method for producing a sputtering target of the present invention is categorized into three types and is characterized in that a mixed powder of NaF powder and Cu—Ga powder or a mixed powder of NaF powder, Cu—Ga powder, and Cu powder is produced in advance to thereby employ the resulting mixed powder. Specifically, (1) A method for producing a sputtering target is characterized in that the method includes the steps of forming a molded article from the mixed powder; and sintering the molded article in a vacuum atmosphere, an inert gas atmosphere, or a reducing atmosphere.

(2) A method for producing a sputtering target is characterized in that the method includes the step of sintering the mixed powder using a hot pressing in a vacuum atmosphere or an inert gas atmosphere.

(3) A method for producing a sputtering target is characterized in that the method includes the steps of sintering the mixed powder by hot isostatic pressing (HIP).

Specifically, these methods for producing a sputtering target are capable of uniformly distributing NaF in a dispersed manner by sintering the mixed powder using a powder sintering methodology.

On the other hand, when the sputtering target of the composition is produced by a dissolution methodology, NaF is melted at a temperature of 993° C. or greater. Since the specific gravity of NaF is lower than that of Cu or Ga, NaF undesirably segregates to the surface of the molten material, and thus, NaF is difficult to be uniformly dispersed in the target. Also, since NaF is strongly evaporated at a temperature of 1000° C. or greater under atmospheric pressure, the composition of the sputtering target produced by a dissolution methodology at a temperature of 1000° C. or greater is subject to great fluctuations due to the evaporation of the NaF added. On the other hand, in the sputtering target of the present invention produced by any one of the powder sintering methodologies (1) to (3), NaF is present in a Cu—Ga alloy or a green body consisting of Cu—Ga alloy and Cu in a dispersed manner, the stable sputtering target may be realized without the occurrence of cracking after sintering, during machine processing after sintering, and during sputtering.

Also, a method for producing the sputtering target of the present invention is characterized in that, in the production method (1), sintering is performed at a temperature of 700° C. to 950° C. after the formation of the molded article.

Also, a method for producing the sputtering target of the present invention is characterized in that, in the production method (2), hot pressing is performed at a temperature of 500° C. to 800° C.

Also, a method for producing the sputtering target of the present invention is characterized in that, in the production method (3), the hot isostatic pressing is performed at a temperature of 500° C. to 800° C. and at a pressure of 30 MPa to 150 MPa.

Specifically, in these methods for producing the sputtering target of the present invention, sintering is performed under the aforementioned conditions. Thus, a sputtering target may be obtained without the occurrence of cracking during machine processing or with little risk of abnormal discharge during sputtering.

The reason why a sintering temperature is set within the range described above in the production method (1) is as follows. If the sintering temperature is lower than 700° C., the density of the sputtering target is insufficient, and thus, abnormal discharge often occurs during sputtering of the sputtering target. On the other hand, if the sintering temperature exceeds 950° C., the evaporation of NaF may start, and thus, the composition of the target may be different from the target composition thereof. Note that the sintering temperature is preferably within the range of 700° C. to 750° C.

The reason why a hot pressing temperature is set within the range described above in the production method (2) is as follows. If the hot pressing temperature is lower than 500° C., the density of the sputtering target is insufficient, and thus, abnormal discharge often occurs during sputtering of the sputtering target. On the other hand, if the hot pressing temperature exceeds 800° C., NaF is moved to a Cu—Ga alloy or the grain boundary of Cu particles, resulting in a reduction in the strength of a sintered body. Consequently, cracking or chipping may easily occur upon machine processing or during sputtering. Note that the hot pressing temperature is preferably within the range of 650° C. to 750° C.

The reason why the sintering temperature and the pressure of the hot isostatic pressing (3) is set within the range described above in the production method (3) is as follows. If the sintering temperature is lower than 500° C. or the pressure is lower than 30 MPa, the density of the sputtering target is insufficient, and thus, abnormal discharge often occurs during sputtering of the sputtering target. On the other hand, if the sintering temperature exceeds 800° C., the strength of a sputtering target becomes low, and thus, cracking or chipping may easily occur upon machine processing or during sputtering. Note that the sintering temperature is preferably within the range of 550° C. to 650° C.

Effects of the Invention

According to the present invention, the following effects may be provided.

Specifically, according to the sputtering target of the present invention and a method for producing the same, 20 to 40 at % of Ga and 0.05 to 1 at % of Na are contained as metal components except fluorine (F) of the sputtering target, a remaining portion has a component composition consisting of Cu and unavoidable impurities, and Na is contained in the state of a NaF compound. Thus, a Cu—Ga film containing Na which is effective for the improvement in power generation efficiency may be formed using the sputtering method. Therefore, the sputtering target of the present invention is employed so as to form a light absorbing layer using the sputtering method, a solar cell, to which Na may favorably be added and exhibits high power generation efficiency, may be produced.

DESCRIPTION OF THE EMBODIMENTS

Hereinafter, a description will be given of one embodiment of the sputtering target of the present invention and a method for producing the same.

In the sputtering target of the present embodiment, 20 to 40 at % of Ga and 0.05 to 1 at % of Na are contained as metal components except fluorine (F) of the sputtering target, and a remaining portion has a component composition consisting of Cu and unavoidable impurities.

Also, the sputtering target of the present embodiment has a structure in which NaF is dispersed in the target green body and the average particle size of the NaF is 5 μm or lower.

The number of NaF particles in the field of view of 0.1 mm$^2$, when the cross-section of the target is observed using a SEM, is preferably three or less if there are NaF particles having a large particle diameter of 10 μm to 40 μm.

Furthermore, Ga in the target green body is contained in a form of a Cu—Ga binary alloy.

The method for producing a sputtering target of the present embodiment is categorized into three types and is characterized in that a mixed powder of NaF powder and Cu—Ga alloy powder or a mixed powder of NaF powder, Cu—Ga alloy powder, and Cu powder is prepared in advance to thereby employ the resulting mixed powder.

(1) A sputtering target production method in which the mixed powder is filled in a forming mold and subject to tapping without pressure molding or pressing to thereby form a molded article having a constant bulk density, and the molded article is subject to sintering at a temperature of 700° C. to 950° C. in a vacuum atmosphere, an inert gas atmosphere, or a reducing atmosphere.

(2) A sputtering target production method in which the mixed powder is subject to hot pressing at a temperature in the range of 500° C. to 800° C. in a vacuum atmosphere or an inert gas atmosphere.

(3) A sputtering target production method in which the mixed powder is subject to sintering at a temperature of 500° C. to 800° C. and a pressure of 30 MPa to 150 MPa by hot isostatic pressing.

The mixed powder is prepared using any one of the following methods (1) to (3).

(1) NaF preferably has a purity of 3N or greater and a primary particle diameter of 0.3 μm or less. NaF is finely dispersed with a mean secondary particle diameter of 5 μm or lower using a pulverizing device (e.g., ball mill, jet mill, Henshell mixer, attritor, or the like). Furthermore, the resulting finely-dispersed powder is mixed and pulverized with a Cu—Ga alloy powder having the target composition using a mixing and pulverizing device (e.g., ball mill, Henshell mill, jet mill, V-shaped mixer, or the like) to thereby prepare raw material powder. Since NaF is water-soluble, a dry-type mixing and pulverizing device without using water is preferably employed instead of a wet-type mixing and pulverizing device with using water.

(2) NaF preferably has a purity of 3N or greater and a primary particle diameter of 0.3 μm or less. Both NaF and a preprepared Cu—Ga alloy powder of the target composition are simultaneously placed in a mixing and pulverizing device (e.g., ball mill, jet mill, Henshell mixer, attritor, V-shaped mixer, or the like), mixing the resulting mixture and finely-dispersing NaF are simultaneously performed until the mean secondary particle diameter of NaF becomes 5 μm or less to thereby prepare raw material powder.

(3) Cu—Ga alloy powder is prepared such that the content of the prepared Cu—Ga alloy powder in advance is greater than that of Ga in the target composition. Cu—Ga alloy powder is mixed with NaF. Furthermore, Cu—Ga alloy powder (or pure Cu powder) having a low Ga content is added and mixed so as to be the composition of the expected sputtering target to thereby prepare raw material powder.

Raw material powder that is prepared by any one of the methods (1) to (3) is preferably stored in a dry environment. This is for the purpose of preventing water moisture absorption due to NaF or aggregation of NaF particles due to moisture absorption from being occurred.

Also, in order to prevent oxidization of a Cu—Ga alloy or Cu, pressureless sintering, hot pressing, and hot isostatic pressing are carried out in a vacuum atmosphere, in an inert gas atmosphere, or in a reducing atmosphere. Furthermore, in the pressureless sintering, the presence of hydrogen in an atmosphere is advantageous in providing improvement of sinterability, and the content of hydrogen in an atmosphere is preferably 1% or greater. In the hot pressing, the pressure applied during hot pressing may affect the density of the target sintered body, and thus, the pressure to be applied is preferably in the range of 100 kgf/cm$^2$ to 500 kgf/cm$^2$. Also, pressurization may be performed before starting the elevation of temperature or may be applied following the arrival of a certain temperature.

Next, the Cu—Ga—NaF sintered body as described above is processed into a specified shape of a target using regular discharge processing, cutting, or grinding processing. Since NaF is water-soluble, a dry-type method without using a cooling liquid or a wet-type method using a water-free cooling liquid is preferably employed during processing. Also, after the surface-roughening processing using a wet-type method, the surface may further be processed by a dry-type method.

Next, the processed target is bonded to a backing plate consisting of Cu or SUS (stainless) or other metals (e.g., Mo) using In as a solder, and the resulting target is provided to sputtering. In order to measure a percent bond area of the bonding portion, a method for immersing the entire target into water so as to specify air bubbles or defects in a solder layer using ultrasonic waves may be employed. However, since NaF is water-soluble, measures are required such that the target is not brought into direct contact with water when the percent bond area of such bonding portion is measured. For example, a method for applying oils to the entire surface of the target and removing the oils after measurement, or a method for coating the target with a waterproofing sheet may be employed.

In order to prevent oxidization of the processed target and moisture absorption from being occurred, the entire target is preferably stored in a vacuum pack or a pack purged with inert gas.

The thus produced Cu—Ga—NaF target is subject to sputtering using a DC magnetron sputtering device, where Ar gas is employed as sputtering gas. For the direct-current (DC) sputtering, a pulse DC power supply for applying a pulse voltage or a non-pulse DC power supply may also be employed. An applied power during sputtering is preferably in the range of from 1 to 10 W/cm$^2$. The thickness of the film formed by the Cu—Ga—NaF target is in the range of from 1000 to 2000 nm.

In the sputtering target of the present embodiment, since 20 to 40 at % of Ga and 0.05 to 1 at % of Na are contained as metal components except fluorine (F) of the sputtering target, a remaining portion has a component composition consisting of Cu and unavoidable impurities, a Cu—Ga film favorably containing Na which has a high melting point (993° C.) and a boiling point (1700° C.) and is effective for the improvement in power generation efficiency may be formed using the sputtering method.

Also, the sputtering target has a structure in which NaF is dispersed in the target green body and the average particle size of the NaF is 5 μm or lower, whereby abnormal discharge due to NaF may be suppressed, and thus, stable direct-current sputtering may become possible.

Furthermore, Ga in the target green body is contained in a form of a Cu—Ga binary alloy. By setting Ga to a Cu—Ga solid solution or a Cu—Ga intermetallic compound, stable sputtering may be realized without the occurrence of cracking after sintering, after machine processing, and during sputtering.

In the method for producing a sputtering target of the present embodiment, NaF can be uniformly distributed in a dispersed manner by a powder sintering methodology using the mixed powder instead of a dissolution methodology.

EXAMPLES

Next, the sputtering target of the present invention and a method for producing the same will be specifically described with reference to the evaluation result of the actually produced sputtering target by way of Examples, based on the aforementioned embodiment.

[Examples]

Firstly, Cu—Ga binary alloy powder and Cu powder (purity 4 N) No. 1 to No. 15 having the component composition and the particle diameter shown in Table 1 were prepared, and to each of which was added NaF powder having a purity of 3N and a primary mean particle diameter of 0.2 μm as shown in Table 1. Each of these raw materials was placed in a polyethylene pot having a volume of 10 L, ZrO$_2$ ball having φ of 5 mm was further added in the pot, and the resulting mixture was mixed and pulverized in a ball mill until the secondary particle diameter of NaF became 5 μm or lower. The obtained mixed powder was sintered using the sintering method and the sintering condition as specified in Table 2.

In the case of pressureless sintering as shown in Examples 12 and 13, mixed powder was filled in a metal mold, and then pressurized at a pressure of 1500 kg/cm$^2$ at normal temperatures to thereby form a molded article.

In the case of hot pressing, vacuum hot pressing was performed using a graphite mold at a pressure of 20 MPa.

In the case of hot isostatic pressing, mixed powder was firstly filled in a metal mold, and was pressure-molded at normal temperatures at a pressure of 1500 kgf/cm$^2$. The obtained molded article was put into a stainless container having a thickness of 0.5 mm, and was subject to vacuum de-aeration to thereby be provided to hot isostatic pressing.

These sintered bodies were subject to dry cutting processing to thereby produce targets (Examples 1 to 15) having the size of φ 125 (mm)×5 (mm) T.

TABLE 2

| | RAW MATERIAL POWDER | | | | | | | | | |
|---|---|---|---|---|---|---|---|---|---|---|
| | Cu—Ga I | | | Cu—Ga II | | | Cu | | NaF | |
| | MEAN PARTICLE DIAMETER (μm) | COMPOSITION ATOMIC RATIO (Ga/Ga + Cu) | AMOUNT ADDED (g) | MEAN PARTICLE DIAMETER (μm) | COMPOSITION ATOMIC RATIO (Ga/Ga + Cu) | AMOUNT ADDED (g) | MEAN PARTICLE DIAMETER (μm) | AMOUNT ADDED (g) | AMOUNT ADDED (g) | MIXING TIME (HOUR) |
| EXAMPLE 1 | 60 | 0.21 | 6420 | — | — | — | — | — | 21 | 3 |
| EXAMPLE 2 | 60 | 0.40 | 6550 | — | — | — | — | — | 20.5 | 3 |
| EXAMPLE 3 | 100 | 0.21 | 6350 | — | — | — | — | — | 42 | 2 |
| EXAMPLE 4 | 50 | 0.30 | 6475 | — | — | — | — | — | 21 | 4 |
| EXAMPLE 5 | 150 | 0.30 | 6510 | — | — | — | — | — | 10 | 5 |
| EXAMPLE 6 | 120 | 0.30 | 6535 | — | — | — | — | — | 2.1 | 4 |

TABLE 2-continued

| | | | | | | | | | | |
|---|---|---|---|---|---|---|---|---|---|---|
| EXAMPLE 7 | 70 | 0.31 | 6400 | — | | | — | | 40 | 3 |
| EXAMPLE 8 | 150 | 0.33 | 3900 | — | | | 30 | 2509 | 20 | 2 |
| EXAMPLE 9 | 200 | 0.27 | 3510 | 40 | 0.13 | 2900 | — | | 20 | 3 |
| EXAMPLE 10 | 100 | 0.47 | 4285 | — | | | 60 | 2195 | 20 | 4 |
| EXAMPLE 11 | 60 | 0.40 | 3800 | 110 | 0.17 | 2710 | — | | 10.5 | 3 |
| EXAMPLE 12 | 150 | 0.33 | 3900 | — | | | 30 | 2509 | 20 | 2 |
| EXAMPLE 13 | 50 | 0.30 | 6475 | — | | | | | 21 | 4 |
| EXAMPLE 14 | 100 | 0.47 | 4285 | — | | | 60 | 2195 | 20 | 4 |
| EXAMPLE 15 | 70 | 0.31 | 6400 | — | | | — | | 40 | 3 |

| | SINTERING METHOD | SINTERING CONDITION | | SINTERED BODY COMPOSITION | | | SINTERED BODY NaF PARTICLE DIAMETER (μm) | THE NUMBER OF NaF AGGREGATE PARTICLES WITH THE SIZE OF 10 TO 40 μm IN THE AREA OF 0.1 mm$^2$ | PRESENCE/ABSENCE OF METALLIC Ga PHASE USING XRD |
|---|---|---|---|---|---|---|---|---|---|
| | | TEMPERATURE (° C.) | KEEP TIME (HOUR) | Na (at %) | Ga (at %) | Cu (at %) | | | |
| EXAMPLE 1 | HOT PRESSING | 800 | 1.5 | 0.5 | 20 | REMAINING | 1 | 1 | ABSENT |
| EXAMPLE 2 | | 600 | 3.0 | 0.5 | 40 | REMAINING | 0.7 | 1 | ABSENT |
| EXAMPLE 3 | | 700 | 2.0 | 1 | 20 | REMAINING | 4 | 2 | ABSENT |
| EXAMPLE 4 | | 700 | 2.0 | 0.5 | 30 | REMAINING | 0.9 | 0 | ABSENT |
| EXAMPLE 5 | | 650 | 3.0 | 0.25 | 30 | REMAINING | 1 | 0 | ABSENT |
| EXAMPLE 6 | | 750 | 3.0 | 0.05 | 30 | REMAINING | 1 | 0 | ABSENT |
| EXAMPLE 7 | | 700 | 3.0 | 1 | 30 | REMAINING | 3 | 1 | ABSENT |
| EXAMPLE 8 | | 700 | 2.0 | 0.5 | 20 | REMAINING | 2 | 2 | ABSENT |
| EXAMPLE 9 | | 800 | 1.5 | 0.5 | 20 | REMAINING | 2 | 1 | ABSENT |
| EXAMPLE 10 | | 600 | 4.0 | 0.5 | 30 | REMAINING | 1 | 0 | ABSENT |
| EXAMPLE 11 | | 600 | 3.0 | 0.25 | 30 | REMAINING | 1 | 1 | ABSENT |
| EXAMPLE 12 | PRESSURELESS SINTERING | 700 # | 2.0 | 0.5 | 20 | REMAINING | 2 | 2 | ABSENT |
| EXAMPLE 13 | | 800 ## | 2.0 | 0.5 | 30 | REMAINING | 2 | 1 | ABSENT |
| EXAMPLE 14 | HOT ISOSTATIC PRESSING | 600 (PRESSURE 100 Mpa) | 1.0 | 0.5 | 30 | REMAINING | 1 | 0 | ABSENT |
| EXAMPLE 15 | SINTERING | 600 (PRESSURE 80 Mpa) | 1.0 | 0.9 | 30 | REMAINING | 2 | 1 | ABSENT |

\# (EXAMPLE 12) 100% H$_2$ ATMOSPHERE
\#\# (EXAMPLE 13) 97% N$_2$, 3% H$_2$ ATMOSPHERE
\* Na CONTENT IN SINTERED BODY = Na/(Na + Cu + Ga) * 100%, Ga CONTENT IN SINTERED BODY = Ga/(Na + Cu + Ga) * 100%

[Evaluation]

In the present Examples 1 to 15, the targets subjected to machine processing were visually observed for the presence/absence of chipping and cracking, and the structure of each of the obtained sintered bodies was observed using an electron-probe micro analyzer (hereinafter referred to as "EPMA") (JXA-8500F manufactured by Nihon Densi Corporation).

Also, when the structure was observed using an EPMA, ten photographs (500 times) in a region of interest for the observation of 0.05 mm$^2$ were taken. Among them, the size of the observable NaF particles (0.5 μm or greater) was measured to thereby calculate the average particle size. At the same time, the number of NaF aggregate particles having the particle diameter of 10 μm to 40 μm per 0.1 mm$^2$ was calculated.

Note that the average size of NaF particles may be measured by the following procedures (a) to (c).
(a) Ten COMPO images (60 μm×80 μm) with a magnification of 500 times are taken using a field emission EPMA.
(b) The taken images are converted into monochrome images using commercially available image analysis software and are subject to binarization using a single threshold value.

With this arrangement, when the amount of NaF content in an area is greater, such area will be displayed in black.

Examples of such image analysis software include WinRoof Ver 5.6.2 (manufactured by Mitani Shoji Co., Ltd.) or the like. Also, the term "binarization" refers to the fact that a certain "threshold value" is set to the luminance (brightness) for each pixel of an image so as to distinguish an area such that "0" is given to each pixel if the luminance is equal to or lower than a threshold value and "1" is given to each pixel if the luminance is greater than a threshold value.

(c) The maximum threshold value for not selecting the entire image is set to 100%, and the threshold value of 30 to 35% is employed to thereby select an area displayed in black.

Then, the selected area is contracted four times and expanded three times. The resulting area is intended to be NaF particles so as to measure the size of each individual particle.

An example of magnification used for area contraction and expansion is 2.3%. With this operation, a diameter corresponding to a circle is determined from the area of each particle to thereby determine a particle diameter.

Also, the presence of Ga simple substance in the target green body was specified as it is using the XRD chart of the sintered target. Specifically, the surface of each of these hot pressed bodies was polished (Ra: 5 μm or lower), and then was subject to X-ray diffraction (XRD). Consequently, the presence of a Ga single phase was specified using a peak near the angles θ of 15.24° (orientation 111), 22.77° (113), and 23.27° (202) which belong to a Ga single phase.

Also, quantitative analysis for Ga content and Na content in the produced Cu—Ga—NaF target as a metallic component excluding fluorine was carried out using an ICP method (high frequency induction coupled plasma method).

Furthermore, a film having a thickness of 1000 nm was formed on a blue glass plate having a thickness of 3.2 mm, on which was coated with a Mo sputtering film, by means of 5 W/cm$^2$ direct-current sputtering using a magnetron sputtering device and the target. Note that the thickness of the Mo sputtering film was 500 nm.

The Ar pressure during sputtering was 1.3 Pa, and the distance between the target and the substrate was 70 mm. The substrate heating during film formation was not performed. Furthermore, the number of times that abnormal discharge occurred during continuous sputtering for ten minutes under the aforementioned conditions was automatically recorded using an arcing counter attached to a sputtering power supply.

Such sputtering was repeated five times. Then, the surface of each target was observed, and the surface of each target was visually observed for the presence/absence of chipping and cracking occurred during sputtering. The results are shown in Table 3.

TABLE 3

|  | CRACKING OR CHIPPING AFTER MACHINING | CRACKING OR CHIPPING DURING SPUTTERING | THE NUMBER OF ABNORMAL DISCHARGE DURING SPUTTERING (TIMES/10 MIN CONTINUOUS DISCHARGE) |
| --- | --- | --- | --- |
| EXAMPLE 1 | NONE | NONE | 3 |
| EXAMPLE 2 | NONE | NONE | 4 |
| EXAMPLE 3 | NONE | NONE | 50 |
| EXAMPLE 4 | NONE | NONE | 0 |
| EXAMPLE 5 | NONE | NONE | 0 |
| EXAMPLE 6 | NONE | NONE | 0 |
| EXAMPLE 7 | NONE | NONE | 20 |
| EXAMPLE 8 | NONE | NONE | 15 |
| EXAMPLE 9 | NONE | NONE | 2 |
| EXAMPLE 10 | NONE | NONE | 0 |
| EXAMPLE 11 | NONE | NONE | 1 |
| EXAMPLE 12 | NONE | NONE | 4 |
| EXAMPLE 13 | NONE | NONE | 0 |
| EXAMPLE 14 | NONE | NONE | 1 |
| EXAMPLE 15 | NONE | NONE | 15 |

Also, the Na, F, and Ga content were measured at five locations of each sputtered film using the EPMA. After measurement, the samples were further subject to heat treatment at a temperature of 500° C. for ten minutes in an infrared image furnace purged with pure $N_2$. After cooling, the Na, F, and Ga content in a film were again measured using the EPMA. The results with these average values are shown in Table 4.

TABLE 4

|  | VALUE MEASURED ON ELEMENTAL BASIS IN FILM BEFORE HEAT TREATMENT | | VALUE MEASURED ON ELEMENTAL BASIS IN FILM AFTER HEAT TREATMENT | |
| --- | --- | --- | --- | --- |
|  | Na (at %) | F (at %) | Na (at %) | F (at %) |
| EXAMPLE 1 | 0.3 | 0.04 | 0.4 | 0.00 |
| EXAMPLE 2 | 0.4 | 0.03 | 0.6 | 0.00 |
| EXAMPLE 3 | 1.3 | 1.50 | 1.3 | 0.00 |
| EXAMPLE 4 | 0.3 | 0.03 | 0.35 | 0.00 |
| EXAMPLE 5 | 0.1 | 0.02 | 0.2 | 0.00 |
| EXAMPLE 6 | 0.05 | 0.00 | 0.1 | 0.00 |
| EXAMPLE 7 | 1.4 | 1.40 | 1.4 | 0.00 |
| EXAMPLE 8 | 0.4 | 0.20 | 0.4 | 0.00 |
| EXAMPLE 9 | 0.4 | 0.30 | 0.4 | 0.00 |
| EXAMPLE 10 | 0.3 | 0.10 | 0.4 | 0.00 |
| EXAMPLE 11 | 0.1 | 0.00 | 0.2 | 0.00 |
| EXAMPLE 12 | 0.3 | 0.20 | 0.3 | 0.00 |
| EXAMPLE 13 | 0.3 | 0.05 | 0.35 | 0.00 |
| EXAMPLE 14 | 0.3 | 0.12 | 0.3 | 0.00 |
| EXAMPLE 15 | 1.4 | 1.20 | 1.5 | 0.00 |

* Na CONTENT IN FILM = Na/(Na + F + Cu + Ga)*100% F CONTENT IN FILM = F/(Na + F + Cu + Ga)*100%

[Comparative Examples]

Cu—Ga powder having the component composition and the particle diameter shown in Table 5 or Cu powder and Ga metal were prepared, and NaF similar to that in Table 1 was further prepared. These raw materials were mixed in a similar manner as those of Examples of the present invention. The resulting mixture was sintered by hot pressing, pressureless sintering, or hot isostatic pressing under the conditions shown in Table 6. Note that the Na content of any of the targets of Comparative Examples falls outside the range of from 0.05 at % to 1 at %.

In Comparative Examples 9 and 10 shown in Table 5, the mixed powder using a vacuum melting furnace was melted in a graphite crucible, and was cast into an iron mold. After cooling, the resulting powder was subject to machine processing such as dry-type cutting.

TABLE 5

|  | RAW MATERIAL POWDER | | | | |
| --- | --- | --- | --- | --- | --- |
|  | Cu—Ga | | Ga | NaF | |
|  | MEAN PARTICLE DIAMETER (μm) | COMPOSITION ATOMIC RATIO (Ga/Ga + Cu) | AMOUNT ADDED (g) | AMOUNT ADDED (g) | AMOUNT ADDED (g) | MIXING TIME (HOUR) |
| COMPARATIVE EXAMPLE 1 | 60 | 0.21 | 6287 | — | 63 | 3 |
| COMPARATIVE EXAMPLE 2 | 60 | 0.21 | 6287 | — | 63 | 1 |
| COMPARATIVE EXAMPLE 3 | 50 | 0.21 | 6287 | — | 63 | 4 |
| COMPARATIVE EXAMPLE 4 | 60 | 0.43 | 6220 | — | 125 | 3 |
| COMPARATIVE EXAMPLE 5 | 100 | 0.20 | 6475 | — | 1.25 | 3 |
| COMPARATIVE EXAMPLE 6 | 150 | 0.31 | 6350 | — | 63 | 5 |
| COMPARATIVE EXAMPLE 7 | 120 | 0.30 | 6540 | — | 0.8 | 4 |
| COMPARATIVE EXAMPLE 8 | 70 | 0.30 | 6257 | 90 | 63 | 2 |
| COMPARATIVE EXAMPLE 9 | 150 | 0.33 | 3905 | — | 63 | 2 |
| COMPARATIVE EXAMPLE 10 | 100 | 0.47 | 4285 | — | 63 | 3 |

TABLE 5-continued

| | RAW MATERIAL POWDER | | | | | |
|---|---|---|---|---|---|---|
| | Cu—Ga | | | Ga | NaF | |
| | MEAN PARTICLE DIAMETER (μm) | COMPOSITION ATOMIC RATIO (Ga/Ga + Cu) | AMOUNT ADDED (g) | AMOUNT ADDED (g) | AMOUNT ADDED (g) | MIXING TIME (HOUR) |
| COMPARATIVE EXAMPLE 11 | 150 | 0.31 | 6350 | — | 63 | 5 |
| COMPARATIVE EXAMPLE 12 | 150 | 0.31 | 6350 | — | 63 | 5 |

TABLE 6

| | SINTERING METHOD | TEMPERATURE (° C.) | KEEP TIME (HOUR) | SINTERED BODY COMPOSITION | | | SINTERED BODY NaF PARTICLE DIAMETER (μm) | THE NUMBER OF NaF AGGREGATE PARTICLES WITH THE SIZE OF 10 TO 40 μm IN THE AREA OF 0.1 mm$^2$ | PRESENCE/ ABSENCE OF METALLIC Ga PHASE USING XRD |
|---|---|---|---|---|---|---|---|---|---|
| | | | | Na (at %) | Ga (at %) | Cu (at %) | | | |
| COMPARATIVE EXAMPLE 1 | HOT PRESSING | 950 | 1.5 | 1.5 | 20 | REMAINING | 3 | 1 | ABSENT |
| COMPARATIVE EXAMPLE 2 | | 600 | 3.0 | 1.5 | 20 | REMAINING | 10 | 8 | ABSENT |
| COMPARATIVE EXAMPLE 3 | | 300 | 2.0 | 1.5 | 20 | REMAINING | 2 | 2 | ABSENT |
| COMPARATIVE EXAMPLE 4 | | 700 | 2.0 | 3.0 | 40 | REMAINING | 4 | 0 | ABSENT |
| COMPARATIVE EXAMPLE 5 | | 650 | 3.0 | 0.03 | 20 | REMAINING | 0.6 | 0 | ABSENT |
| COMPARATIVE EXAMPLE 6 | | 750 | 3.0 | 1.5 | 30 | REMAINING | 1 | 0 | ABSENT |
| COMPARATIVE EXAMPLE 7 | | 700 | 3.0 | 0.02 | 30 | REMAINING | 0.6 | 1 | ABSENT |
| COMPARATIVE EXAMPLE 8 | | 750 | 2.0 | 1.5 | 30 | REMAINING | 2 | 6 | PRESENT |
| COMPARATIVE EXAMPLE 9 | MELTING/ CASTING METHOD | 1150# | 0.3 | 0.02 | 20 | REMAINING | 20 | 1 | ABSENT |
| COMPARATIVE EXAMPLE 10 | | 1250# | 0.5 | 0.0 | 30 | REMAINING | N/A | 0 | ABSENT |
| COMPARATIVE EXAMPLE 11 | PRESSURELESS SINTERING ## | 800 | 2.0 | 1.5 | 30 | REMAINING | 2 | 1 | ABSENT |
| COMPARATIVE EXAMPLE 12 | HOT ISOSTATIC PRESSING SINTERING | 400 (PRESSURE 80 Mpa) | 2.0 | 1.5 | 30 | REMAINING | 1 | 2 | ABSENT |

(COMPARATIVE EXAMPLES 9 AND 10) KEEP TEMPERATURE OF MOLTEN METAL DURING DISSOLUTION
(COMPARATIVE EXAMPLE 11) SINTERING IN THE ATMOSPHERE
* Na CONTENT IN SINTERED BODY = Na/(Na + Cu + Ga) * 100% Ga CONTENT IN SINTERED BODY = Ga/(Na + Cu + Ga) * 100%

The evaluation of Comparative Examples was performed in a similar manner as that of Examples. The evaluation results are shown in Table 7 and Table 8.

TABLE 7

| | CRACKING OR CHIPPING AFTER MACHINING | CRACKING OR CHIPPING DURING SPUTTERING | THE NUMBER OF ABNORMAL DISCHARGE DURING SPUTTERING (TIMES/10 MIN CONTINUOUS DISCHARGE) |
|---|---|---|---|
| COMPARATIVE EXAMPLE 1 | NONE | CHIPPED | 100 |
| COMPARATIVE EXAMPLE 2 | NONE | CRACKED | 10023 |
| COMPARATIVE EXAMPLE 3 | NONE | CRACKED | 8530 |
| COMPARATIVE EXAMPLE 4 | NONE | CRACKED | 6003 |
| COMPARATIVE EXAMPLE 5 | NONE | NONE | 0 |
| COMPARATIVE EXAMPLE 6 | NONE | NONE | 0 |
| COMPARATIVE EXAMPLE 7 | NONE | NONE | 5 |
| COMPARATIVE EXAMPLE 8 | CRACKED | — | — |

TABLE 7-continued

|  | CRACKING OR CHIPPING AFTER MACHINING | CRACKING OR CHIPPING DURING SPUTTERING | THE NUMBER OF ABNORMAL DISCHARGE DURING SPUTTERING (TIMES/10 MIN CONTINUOUS DISCHARGE) |
|---|---|---|---|
| COMPARATIVE EXAMPLE 9 | CRACKED | — | — |
| COMPARATIVE EXAMPLE 10 | CRACKED | — | — |
| COMPARATIVE EXAMPLE 11 | NONE | CRACKED | 8901 |
| COMPARATIVE EXAMPLE 12 | NONE | CHIPPED | 3992 |

TABLE 8

|  | VALUE MEASURED ON ELEMENTAL BASIS IN FILM BEFORE HEAT TREATMENT | | VALUE MEASURED ON ELEMENTAL BASIS IN FILM AFTER HEAT TREATMENT | |
|---|---|---|---|---|
|  | Na (at %) | F (at %) | Na (at %) | F (at %) |
| COMPARATIVE EXAMPLE 1 | — | — | — | — |
| COMPARATIVE EXAMPLE 2 | — | — | — | — |
| COMPARATIVE EXAMPLE 3 | — | — | — | — |
| COMPARATIVE EXAMPLE 4 | — | — | — | — |
| COMPARATIVE EXAMPLE 5 | 0.01 | 0.00 | 0.03 | 0.00 |
| COMPARATIVE EXAMPLE 6 | 2.20 | 2.00 | 2.10 | 1.20 |
| COMPARATIVE EXAMPLE 7 | 0.00 | 0.00 | 0.03 | 0.00 |
| COMPARATIVE EXAMPLE 8 | — | — | — | — |
| COMPARATIVE EXAMPLE 9 | — | — | — | — |
| COMPARATIVE EXAMPLE 10 | — | — | — | — |
| COMPARATIVE EXAMPLE 11 | — | — | — | — |
| COMPARATIVE EXAMPLE 12 | — | — | — | — |

* Na CONTENT IN SINTERED BODY = Na/(Na + Cu + Ga)*100%,
Ga CONTENT IN SINTERED BODY = Ga/(Na + Cu + Ga)*100%

Firstly, in Comparative Examples 9 and 10 using a melting/casting method, the composition analysis results in Table 6 indicate that the amount of NaF, which has been detected from a cast body using an ICP composition analysis, is significantly lower than the feed amount thereof. This is because NaF is melted during melting and floated on the surface of the Cu—Ga molten material, and thus, there is little NaF inside the ingot. Also, a small amount of NaF remaining in the ingot has a greater tendency to be aggregated. Thus, the size of NaF particle in the ingot is significantly greater than that of NaF particle in the sintered body using the powder sintering methodology in Examples. Furthermore, in the present Example, both cracking and chipping during machine processing and cracking and chipping during sputtering did not occur as shown in Table 3. On the other hand, as shown in Table 7, cracking or chipping occurred during machine processing in Comparative Examples 8, 9, and 10, and cracking and chipping or significantly abnormal discharge occurred during sputtering in Comparative Examples 1, 2, 3, 4, 11, and 12.

Specifically, in Comparative Example 8 in which the Na content is as great as 1.5 at %, the number of NaF aggregate particles having the particle diameter of from 10 μm to 40 μm is as many as 6, and a metal Ga phase is present, and Comparative Examples 9 and 10 using the melting/casting method, cracking or chipping occurs during machine processing. Also, in Comparative Example 1 in which the Na content is as great as 1.5 at % and a hot pressing temperature is as high as 950° C., Comparative Example 2 in which the Na content is as great as 1.5 at % and the average particle size of NaF is as great as 10 μm, Comparative Example 3 in which the Na content is as great as 1.5 at % and a hot pressing temperature is as low as 300° C., Comparative Example 11 in which pressureless sintering is performed in the atmosphere and the density of the sputtering target is insufficient, and Comparative Example 12 in which the sputtering target having a low density is sintered using hot isostatic pressing at a sintering temperature of 400° C. and a pressure of 80 MPa, cracking or chipping occurs during sputtering.

In any one of the present Examples, the number of times that abnormal discharge occurred during sputtering was 50 times or lower. On the other hand, in Comparative Examples 1, 2, 3, and 4, the number of times that abnormal discharge occurred during sputtering was 100 times or greater. Specifically, in Comparative Example 1 in which the Na content is as great as 1.5 at % and a hot pressing temperature is as high as 950° C., Comparative Example 2 in which the Na content is as great as 1.5 at % and the average particle size of NaF is as great as 10 μm, Comparative Example 3 in which the Na content is as great as 1.5 at % and a hot pressing temperature is as low as 300° C., and Comparative Example 4 in which the Na content is as great as 3 at %, abnormal discharge occurs in many times.

Furthermore, in the present Examples, the Na content in a film before heat treatment is 0.05 at % or greater, and the Na content in a film post heat treatment is 0.3 at % or greater. In the present Examples, the F (fluorine) content in a film post heat treatment is 0 at %, and thus, it is found that F may be removed from a film by heat treatment.

Also, in the present Examples, a metal Ga single phase is not seen using XRD, and thus, all of Ga in the target green body is contained in a form of a Cu—Ga binary alloy.

On the other hand, in Comparative Example 6, the Na content in a film before/after heat treatment is 2 at % or greater, whereas the F (fluorine) content in a film post heat treatment undesirably remains 1 at % or greater. Also, in Comparative Examples 5 and 7 in which the Na content is 0.03 at % and 0.02 at %, respectively, the Na content in a film before/after heat treatment is 0.1 at % or lower, and thus, there is little Na in the film.

In Comparative Examples 1, 2, 3, 4, 8, 9, 10, 11, and 12, cracking and chipping occur, and thus, an element measurement before/after heat treatment is not carried out.

As described above, according to the sputtering target of in the present invention, since 20 to 40 at % of Ga and 0.05 to 1 at % of Na are contained in the state of a NaF compound, and a remaining portion has a component composition consisting of Cu and unavoidable impurities, a Cu—Ga film favorably containing Na which has a high melting point and a boiling point and is effective for the improvement in power generation efficiency may be formed using the sputtering method.

Therefore, the sputtering target of the present invention is employed so as to form a light absorbing layer using the sputtering method, a solar cell, to which Na may favorably be added and exhibits high power generation efficiency, may be produced.

The technical scope of the present invention is not limited to the aforementioned embodiments and Examples, but the present invention may be modified in various ways without departing from the scope or teaching of the present invention.

What is claimed is:

1. A sintered sputtering target consisting of:
   Ga in an amount of 20 to 40 at % of a total amount of Ga, Na, and Cu,
   Na in an amount of 0.05 to 1 at % of the total amount of Ga, Na, and Cu, and
   a remaining portion having a component composition consisting of Cu and unavoidable impurities,
   wherein the Na is present in the form of NaF, which is dispersed in said sputtering target; and
   said NaF has an average particle size of 5 μm or lower.

2. The sputtering target according to claim 1, wherein Ga is contained in a form of a Cu—Ga binary alloy.

3. A method for producing the sputtering target according to claim 1, the method comprising the steps of:
   forming a molded article consisting of a mixed powder of NaF powder and Cu—Ga powder or a mixed powder of NaF powder, Cu—Ga powder, and Cu powder; and
   sintering the molded article in a vacuum atmosphere, an inert gas atmosphere, or a reducing atmosphere.

4. A method for producing the sputtering target according to claim 1, the method comprising the step of:
   sintering a mixed powder of NaF powder and Cu—Ga powder or a mixed powder of NaF powder, Cu—Ga powder, and Cu powder using a hot pressing in a vacuum atmosphere or an inert gas atmosphere.

5. A method for producing the sputtering target according to claim 1, the method comprising the step of:
   sintering a mixed powder of NaF powder and Cu—Ga powder or a mixed powder of NaF powder, Cu—Ga powder, and Cu powder by hot isostatic pressing.

6. The method for producing a sputtering target according to claim 3, wherein sintering is performed at a temperature of 700° C. to 950° C. after the formation of the molded article.

7. The method for producing a sputtering target according to claim 4, wherein hot pressing is performed at a temperature of 500° C. to 800° C.

8. The method for producing a sputtering target according to claim 5, wherein the hot isostatic pressing is performed at a temperature of 500° C. to 800° C. and at a pressure of 30 MPa to 150 MPa.

* * * * *